US008829329B2

(12) United States Patent
Deligianni et al.

(10) Patent No.: US 8,829,329 B2
(45) Date of Patent: Sep. 9, 2014

(54) SOLAR CELL AND BATTERY 3D INTEGRATION

(75) Inventors: Hariklia Deligianni, Yorktown Heights, NY (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1057 days.

(21) Appl. No.: 12/858,535

(22) Filed: Aug. 18, 2010

(65) Prior Publication Data

US 2012/0043814 A1 Feb. 23, 2012

(51) Int. Cl.
*H01M 10/46* (2006.01)
*H01M 10/44* (2006.01)
*H01M 16/00* (2006.01)
*H02J 7/35* (2006.01)
*G06F 17/50* (2006.01)

(52) U.S. Cl.
CPC .......... *H01M 10/456* (2013.01); *H01M 16/006* (2013.01); *H02J 7/35* (2013.01); *G06F 17/5045* (2013.01); *G06F 17/5068* (2013.01); *G06F 17/5081* (2013.01)
USPC ........... 136/244; 320/101; 136/255; 136/264; 136/265

(58) Field of Classification Search
CPC ..... H01M 10/465; H01M 16/006; H02J 7/35; G06F 17/5045; G06F 17/5068; G06F 17/5081
USPC .................. 136/244, 255, 264, 265; 320/101
See application file for complete search history.

(56) References Cited

U.S. PATENT DOCUMENTS

| 4,481,265 | A | | 11/1984 | Ezawa et al. | |
|---|---|---|---|---|---|
| 4,740,431 | A | | 4/1988 | Little | |
| 5,616,185 | A | * | 4/1997 | Kukulka | 136/244 |
| 6,093,884 | A | * | 7/2000 | Toyomura et al. | 136/244 |
| 6,608,464 | B1 | | 8/2003 | Lew et al. | |
| 7,056,751 | B2 | * | 6/2006 | Faris | 438/11 |
| 8,299,556 | B2 | * | 10/2012 | Fertig et al. | 257/432 |
| 8,539,408 | B1 | * | 9/2013 | Cheng et al. | 716/110 |
| 2001/0020485 | A1 | * | 9/2001 | Ford et al. | 136/244 |
| 2002/0092558 | A1 | | 7/2002 | Kim et al. | |
| 2005/0112848 | A1 | * | 5/2005 | Faris | 438/458 |
| 2005/0133081 | A1 | * | 6/2005 | Amato et al. | 136/244 |
| 2007/0277876 | A1 | | 12/2007 | Huang et al. | |

FOREIGN PATENT DOCUMENTS

WO WO 2008/018005 A2 2/2008
WO WO 2009/032986 3/2009

OTHER PUBLICATIONS

Loic Baggetto, et. al., "On the route toward 3D-integrated all-solid-state micro-batteries", Solid State Technology 30, Aug. 2008.

(Continued)

*Primary Examiner* — M'Baye Diao
(74) *Attorney, Agent, or Firm* — Vakzen Alexanian

(57) ABSTRACT

An integrated photovoltaic cell and battery device, a method of manufacturing the same and a photovoltaic power system incorporating the integrated photovoltaic cell and battery device. The integrated photovoltaic cell and battery device includes a photovoltaic cell, a battery, and interconnects providing three-dimensional integration of the photovoltaic cell and the battery into an integrated device for capturing and storing solar energy. Also provided is a design structure readable by a machine to simulate, design, or manufacture the above integrated photovoltaic cell and battery device.

16 Claims, 18 Drawing Sheets

(56) References Cited

OTHER PUBLICATIONS

Raffaelle, Ryne, et.al., "Integrated Solar Power Systems", Conference Record of the Twenthy-Eighth IEEE Photovoltaic Specialists Conference, 2000, pp. 1370-1373.

Raffaelle, Ryne, et. al., "Integrated Thin-Film Solar Power System", 35th Intersociety Energy Conversion Engineering Conference and Exhibit, 2000, vol. 1, pp. 58-62.

P. Singh, et. al., "Fuzzy Logic-Based Micro Power Supply for MEMS Applications", The Sixteenth Annual Battery Conference on Applications and Advances, 2001, pp. 355-357.

* cited by examiner

SOLAR CELL AND BATTERY 3D INTEGRATION

BACKGROUND OF THE INVENTION

The present invention relates generally to photovoltaic technology and, more particularly, to a photovoltaic cell and battery integration using 3D integration.

Photovoltaic devices, or solar cells, are electronic devices that convert solar radiation to electrical energy. Electrical energy generated by a solar cell is commonly stored in batteries for later use.

Solar cells and batteries that are known in present solar power systems are separate components with wired connections. As a result, present solar power systems have large losses and further, are not effective at energy management.

BRIEF SUMMARY

Accordingly, one aspect of the present invention provides an integrated photovoltaic cell and battery device. The device includes: a photovoltaic cell having a first side which has isolated electrical contacts to an n-type layer and a p-type layer which are disposed within the photovoltaic cell; a battery having a first side which has isolated electrical contacts to a cathode and a collector of electrons which are disposed within the battery, wherein the first side of the photovoltaic cell is bonded to the first side of the battery; and at least one interconnect providing three-dimensional integration of the photovoltaic cell and the battery into an integrated device for capturing and storing solar energy.

Another aspect of the present invention provides a method of manufacturing a photovoltaic cell and battery integrated device. A photovoltaic cell is provided wherein a first side of the photovoltaic cell includes isolated electrical contact to both an n-type layer and a p-type layer. A battery is provided. A first side of the battery includes isolated electrical contact to both a cathode and a collector. The photovoltaic cell and the battery are bonded to create an integrated device for capturing and storing solar energy.

Another aspect of the present invention provides a photovoltaic power system that includes a plurality of three-dimensional integrated photovoltaic cell and battery devices, and a logic circuitry to optimize the energy conversion.

DETAILED DESCRIPTION OF PREFERRED EMBODIMENTS

Figure 1:
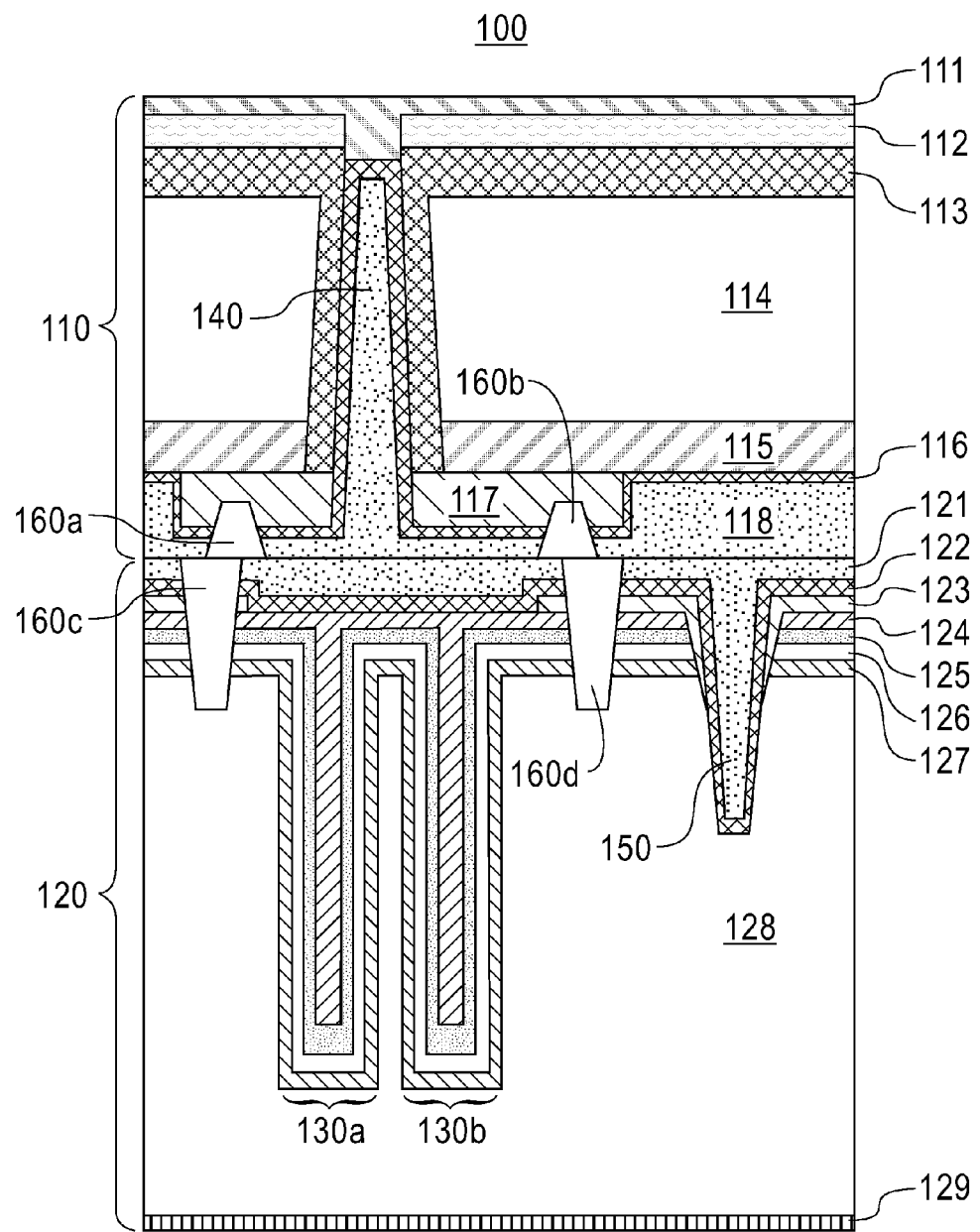
FIG. 1 is a cross-sectional view of an integrated photovoltaic cell and battery device according to an embodiment of the present invention.

FIG. 1 shows an integrated photovoltaic cell and battery device 100 according to a preferred embodiment of the present invention. The device 100 includes a photovoltaic cell 110 and a battery 120 integrated into a single device. The photovoltaic cell 110 converts solar radiation into electrical energy which is stored in the battery 120. The photovoltaic cell 110 and the battery 120 can be manufactured separately to maximize the efficiency of each and then the two can be bonded together into the single integrated device 100.

In the examples shown, the photovoltaic cell 110 is based on crystalline silicon; however, other types of solar cells including thin film solar cells can be used without departing from the scope of the invention. For example, the photovoltaic cell 110 can be based on amorphous silicon, cadmium telluride, or copper indium gallium selenide. For an overview of thin-film solar cell technology, refer to K. L. Chopra, "Thin-Film Solar Cells: An Overview", PROGRESS IN PHOTOVOLTAICS: RESEARCH AND APPLICATIONS, *Prog. Photovolt: Res. Appl.*, 2004: 12:69-92, incorporated herein.

Similarly, in the examples shown, the battery 120 is based on a rechargeable solid-state lithium ion battery. However, the battery 120 can also be other type's batteries without departing from the scope of the invention. For example, the battery 120 can be other types of wet cell or dry cell batteries or a supercapacitor.

In the preferred embodiment shown in FIG. 1, the battery 120 contains multiple three dimensional battery cells 130a and 130b. These three dimensional battery cells 130a and b enlarge the surface area of the battery 120 and therefore increase the energy density. By connecting the battery cells 130a and 130b in parallel the battery voltage remains constant and the battery capacity is extended. The number of battery cells 130a and b is not limited to the number shown in FIG. 1. For a more detailed description of rechargeable solid-state batteries with three dimensional battery cells as described, refer to Loic Baggetto, "On the route toward 3D-integrated all-solid-state micro-batteries", SOLID-STATE TECHNOLOGY, August 2008, incorporated herein.

In the preferred embodiment shown in FIG. 1, the photovoltaic cell 110 includes a first conductive contact layer for the photovoltaic cell 111, a passivation layer 112, a heavily doped n-type silicon layer 113, a p-type silicon layer 114, a heavily doped p-type silicon layer 115, a liner layer 116, a dielectric layer 117 and a second conductive contact layer for the photovoltaic cell 118.

Each of the above layers is common to crystalline silicon photovoltaic cell technology. The scope of the invention is not limited to the above stated layers but may include additional layers or fewer layers. Although FIG. 1 shows surfaces of layers as flat lines, a person of ordinary skill in the art will understand that for single-crystal silicon the surfaces will be textured rather than smooth. In addition, a person of ordinary skill in the art will understand the purpose of each layer as well as the materials that can compose each layer and the appropriate thickness of each layer. Only brief descriptions will be contained herein.

The first conductive contact layer for the photovoltaic cell 111 is a contract grid made of a good conductor, such as a metal, that serves as a collector of electrons. In between the grid typically a protective transparent encapsulate layer will be disposed. In other embodiments the first conductive contact layer 111 can also be made of a transparent conductive oxide.

The passivation layer 112 is a layer of material to serve the purpose of surface passivation and commonly also to provide anti-reflection of incident light.

The heavily doped n-type silicon layer 113 is silicon heavily doped with a material capable of providing extra conduction electrons to create negative electron charge carriers. In other embodiments the n-type layer may be amorphous silicon, cadmium sulfide, zinc sulfide, or zinc oxide.

The p-type silicon layer 114 is silicon doped with a material that results in missing electrons in the silicon lattice to create positive charge carriers. In other embodiments the p-type layer may be amorphous silicon, cadmium telluride, copper indium gallium diselenide, copper indium sulfide selenide, copper gallium selenide sulfide, copper zinc tin selenide sulfide, copper bismuth chalcopyrite compound, or kesterite compound. Although FIG. 1 shows surfaces of layers as flat lines, a person of ordinary skill in the art will understand that for single-crystal silicon the surfaces will be textured rather than smooth.

The heavily doped p-type silicon layer 115 is heavily doped in order to form good electrical contact to electrodes.

The liner layer 116 serves to line the silicon layer to protect against diffusion from the second conductive contact layer 118. Example materials include palladium, nickel, nickel tungsten, and tantanium nitride.

The dielectric layer 117 serves to electrically insulate the doped silicon from the second conductive contact layer 118. The dielectric layer can be composed of any dielectric material, for example, silicon oxide.

The second conductive contact layer for the photovoltaic cell 118 is made of a good conductor, such as a metal. In the preferred embodiment shown in FIG. 1 the second conductive contact layer is made of copper, which can be bonded to the battery.

In the preferred embodiment shown in FIG. 1, the battery 120 includes a first conductive contact layer for the battery 121, a liner layer 122, a dielectric layer 123, a cathode layer 124, an electrolyte layer 125, an anode layer 126, a barrier layer 127, a doped silicon substrate layer 128 and a second conductive contact layer for the battery 129.

Each of the above layers is common to solid state lithium ion battery technology. The scope of the invention is not limited to the above stated layers but may include additional layers or fewer layers. A person of ordinary skill in the art will understand the purpose of each layer as well as the materials that can compose each layer as well as the materials that can compose each layer and the appropriate thickness of each layer. Only brief descriptions will be contained herein.

The first conductive contact layer for the battery 121 is made of a good conductor, such as a metal. The first conductive contact layer for the battery 121 must be made of a material which can be bonded to the second conductive contact layer for the photovoltaic cell 118. In the preferred embodiment shown in FIG. 1 the first conductive contact layer is made of copper.

The liner layer 122 serves to line the silicon layer to protect against diffusion from the first conductive contact layer 121. Example materials include palladium, nickel, nickel tungsten, tantanium nitride.

The dielectric layer 123 serves to electrically insulate the doped silicon from the first conductive contact layer 121. The dielectric layer can be composed of any dielectric material, for example, silicon oxide.

The cathode layer 124 is made of a material into which, and from which, lithium can migrate. In the preferred embodiment the cathode layer 124 is made of lithium cobalt oxide.

The electrolyte layer 125 is made of material which is sufficiently conductive to allow the migration of lithium ions. In the preferred embodiment the electrolyte layer 125 is a solid-state electrolyte layer.

The anode layer 126 is made of material into which, and from which, lithium can migrate. In the present embodiment the anode layer 126 is made of silicon.

The barrier layer 127 is made of material to protect the doped silicon substrate layer 128 from diffusion of lithium ions. In the preferred embodiment the barrier layer 127 is made of titanium nitride.

The doped silicon substrate layer 128 serves as a substrate for etching in vertical structures and is doped to allow for electrical conductivity.

The second conductive contact layer for the battery 129 is made of a good conductor, such as a metal, that serves as a collector of electrons.

The vertical interconnects 140 and 150 provide the electrical connections between the photovoltaic cell 110 and the battery 120. Specifically, vertical interconnect 140 provides electrical connection between the first conductive contact layer for the photovoltaic cell 111 and the first conductive contact layer for the battery 121. The vertical interconnect 150 provides electrical connection between the second conductive contact layer for the photovoltaic cell 118 and the second conductive contact layer for the battery 129. The vertical interconnect 150 need not extend entirely through the doped silicon substrate layer 128 because the substrate is doped to allow for electrical conductivity.

The isolation trenches 160a-d serve to isolate the electrical connection made by vertical interconnect 140 from the electrical connection made by vertical interconnect 150.

Figure 2:
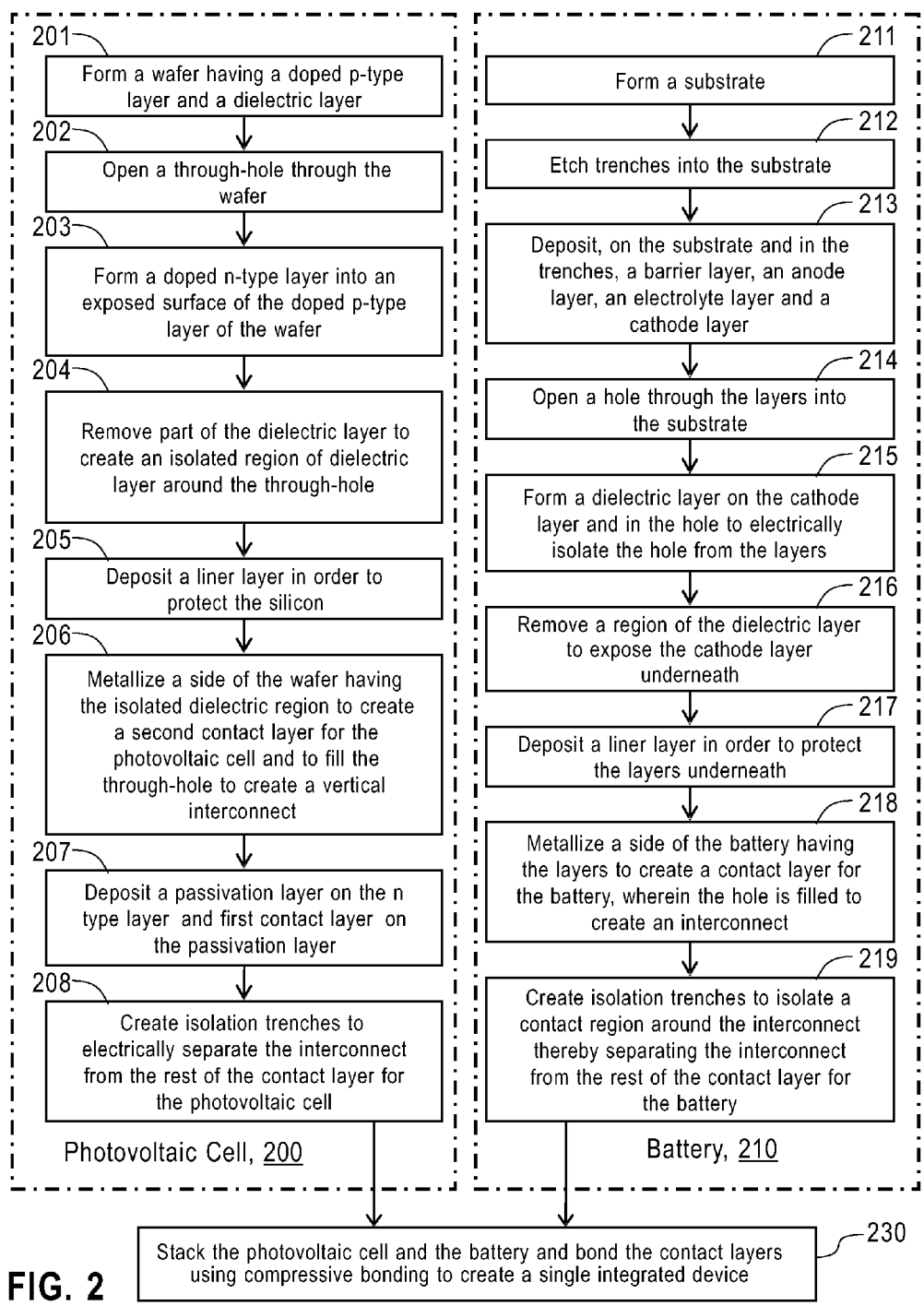
FIG. 2 is a flow chart for manufacturing the integrated photovoltaic cell and battery device according to an embodiment of the present invention.

FIG. 2 shows a flow chart for manufacturing the integrated photovoltaic cell and battery device according to an embodiment of the present invention. The steps shown in FIG. 2 are not meant to limit the scope of the invention but are merely to show a preferred embodiment. The specific steps taken, the number of steps and the order of the steps can be altered without departing from the scope of the invention.

In FIG. 2, on the left side of the flow chart, the photovoltaic cell manufacturing steps 200 are shown. The photovoltaic cell 110 shown in FIG. 1 is manufactured by the manufacturing steps 200. On the right side of the flow chart, the battery manufacturing steps 210 are shown. The battery 120 shown in FIG. 1 is manufactured by the manufacturing steps 210. After the photovoltaic cell 110 and the battery 120 are manufactured, the final step 230 is to stack the photovoltaic cell 110 and the battery 120 and bond the contact layers 118 and 121 to create a single integrated device by using compressive bonding.

Referring to FIG. 2 and the photovoltaic cell manufacturing steps 200, the first step 201 is to form a wafer having a p-type layer 114, 115 and a dielectric layer 117. The second step 202 is to open a through-hole through the wafer. The third step 203 is to form an n-type doped layer 113 into an exposed surface of the p-type layer 114 of the wafer. The forth step 204 is to remove part of the dielectric layer 117 to create an isolated region of dielectric layer around the through-hole. The fifth step 205 is to deposit a liner layer 116 to protect the metal of a vertical interconnect 140 and a contact layer 118 from diffusion. The sixth step 206 is to metallize a side of the wafer that has the isolated dielectric region to create a second contact layer 118 for the photovoltaic cell and to fill the through-hole to create a vertical interconnect 140. The seventh step 207 is to deposit a passivation layer 112 onto the n-type layer 113, remove a portion of passivation layer 112 to expose the vertical interconnect 140 underneath and deposit a first contact layer 111 on the passivation layer 112. The eighth step 208 is to create isolation trenches 160a and 160b to electrically isolate a contact region around the interconnect which separates the interconnect from the rest of the contact layer 118. The result of these steps is the photovoltaic cell 110 shown in FIG. 1.

Referring to FIG. 2 and the battery manufacturing steps 210, the first step 211 is to form a substrate 128. The second step 212 is to etch vertical trenches into the substrate. The third step 213 is to deposit, on the substrate and in the trenches, a barrier layer 127, an anode layer 126, an electrolyte layer 125 and a cathode layer 124. The layers deposited in the trenches create the battery cells 130. The forth step 214 is to open a hole through the layers 124-127 into the substrate. The fifth step 215 is to form a dielectric layer 123, on the cathode layer and in the hole, to electrically isolate the hole from the layers. The sixth step 216 is to remove a region of the dielectric layer 123 to expose the cathode layer 124 underneath. The seventh step 217 is to deposit a liner layer 122 to protect the layers underneath. The eighth step 218 is to metallize a side of the battery 120 that has the layers to create a contact layer 121 and to fill the hole to create the vertical interconnect 150. The ninth step 219 is to create isolation trenches 160c and 160d to isolate a contact region around the interconnect thereby separating the interconnect from the rest of the contact layer 121. The result of these steps is the battery 120 shown in FIG. 1.

FIGS. 3-17 are cross-sectional views of integrated photovoltaic cell and battery device according to a preferred embodiment of the present invention at different stages of the manufacturing process.

Figure 3:
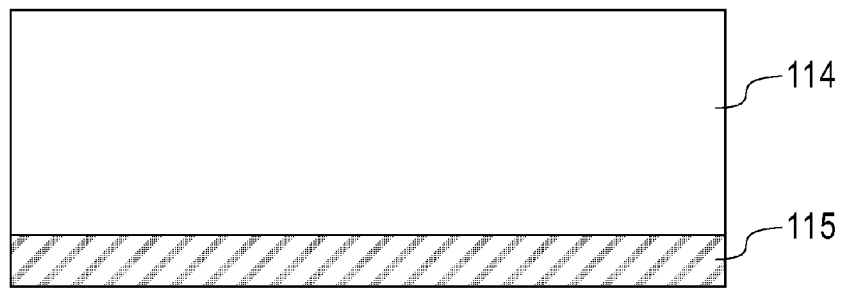
FIG. 3 is a cross-sectional view of the photovoltaic cell in the first manufacturing step for the photovoltaic cell.

FIG. 3 is a cross-sectional view of the photovoltaic cell in the first manufacturing step for the photovoltaic cell. The wafer comprises a doped p-type silicon layer 114 and a heavily doped p-type silicon layer 115.

Figure 4A:
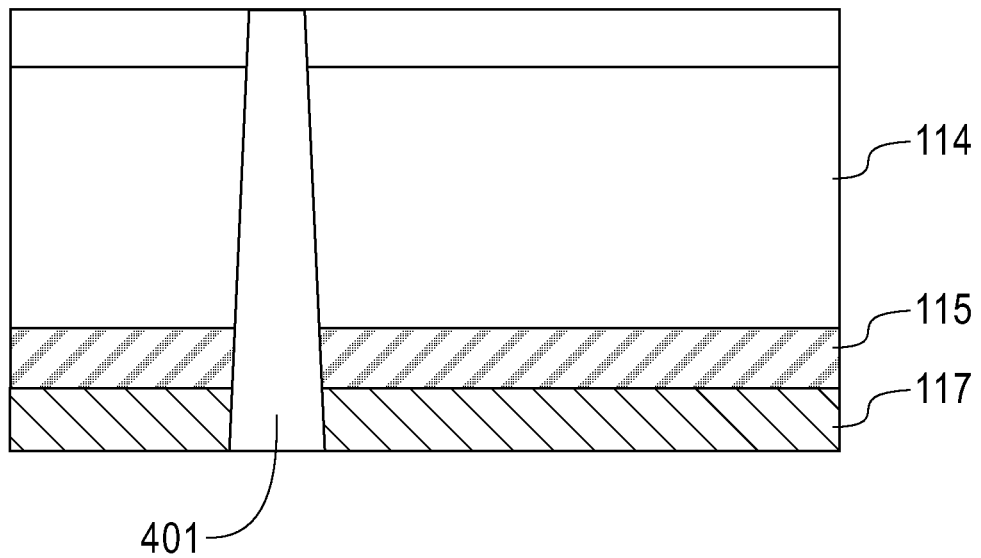
FIG. 4a is a cross-sectional view of the photovoltaic cell in the second manufacturing step for the photovoltaic cell.

FIG. 4a is a cross-sectional view of the photovoltaic cell in the second manufacturing step for the photovoltaic cell. A dielectric layer 117 is deposited onto the wafer. The dielectric can be an oxide or nitride. Then a through-hole 401 is opened through the wafer. The through-hole 401 can be opened by using a laser scribing beam on the dielectric layer 117 and a Bosch process for opening the through-hole through the silicon layers 114 and 115.

Figure 4B:
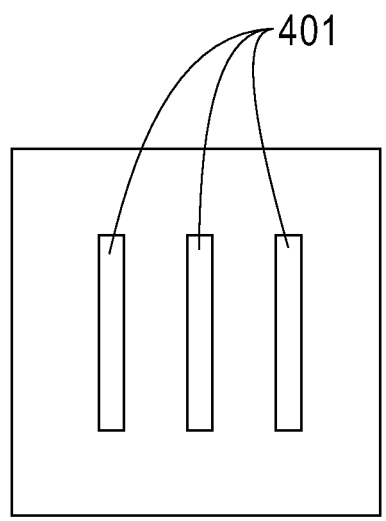
FIG. 4b is a top view of the photovoltaic cell in the second manufacturing step for the photovoltaic cell.

FIG. 4b is a top view of the photovoltaic cell in the second manufacturing step for the photovoltaic cell. The through-holes 401 are shown from a top side which also serves as the light facing side of the integrated device.

Figure 5:
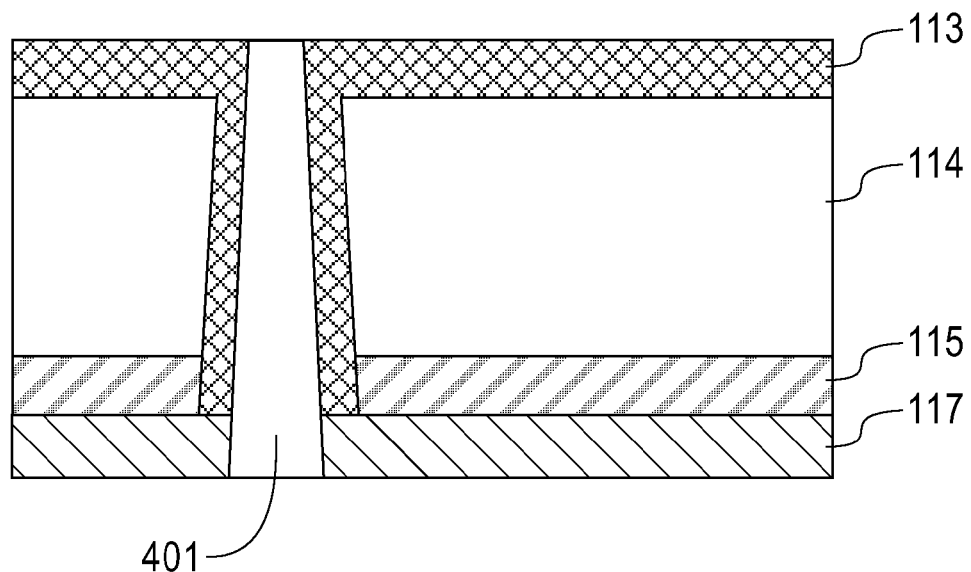
FIG. 5 is a cross-sectional view of the photovoltaic cell in the third manufacturing step for the photovoltaic cell.

FIG. 5 is a cross-sectional view of the photovoltaic cell in the third manufacturing step for the photovoltaic cell. A heavily doped n-type silicon layer 113 is created by diffusion into the exposed surfaces of the doped silicon layers 114 and 115. This creates an n-type region on the walls of the through-hole 401 extending from the top of the wafer to the dielectric layer 117.

Figure 6:
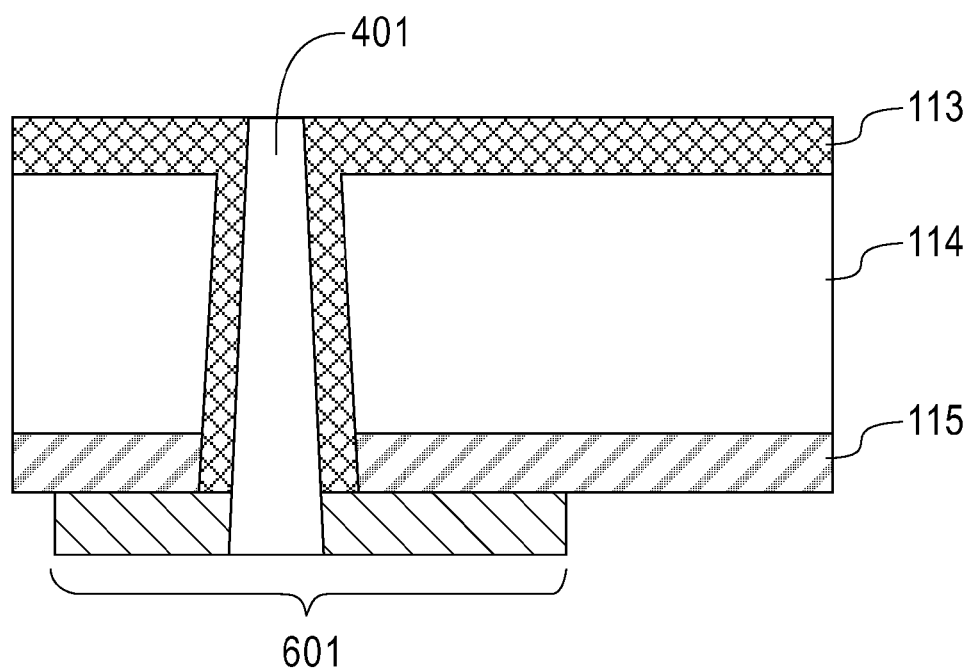
FIG. 6 is a cross-sectional view of the photovoltaic cell in the forth manufacturing step for the photovoltaic cell.

FIG. 6 is a cross-sectional view of the photovoltaic cell in the forth manufacturing step for the photovoltaic cell. An isolated dielectric region 601 is created around the through-hole 401 which can be carried out by using a laser scribing beam.

Figure 7A:
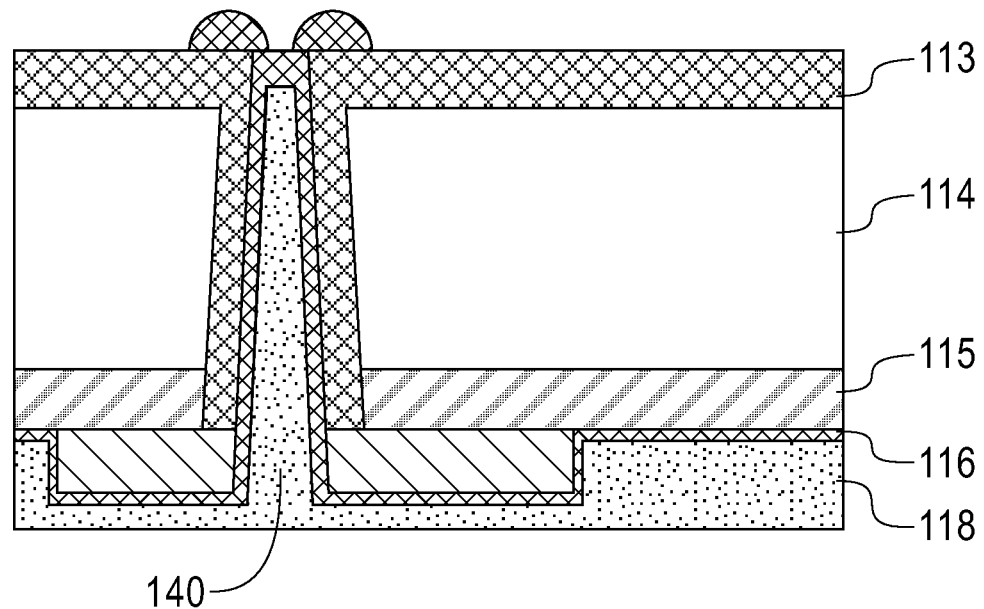
FIG. 7a is a cross-sectional view of the photovoltaic cell in the fifth manufacturing step for the photovoltaic cell.

FIG. 7a is a cross-sectional view of the photovoltaic cell in the fifth manufacturing step for the photovoltaic cell. A liner layer 116 and a contact layer 118 are deposited onto the wafer. The liner layer 116 protects the silicon layer 113, 114, and 115 from diffusion of the contact layer 118. Both the liner layer 116 and the contact layer 118 fill the through hole, 401 in FIG. 6, to create a conductive vertical interconnect 140.

Figure 7B:
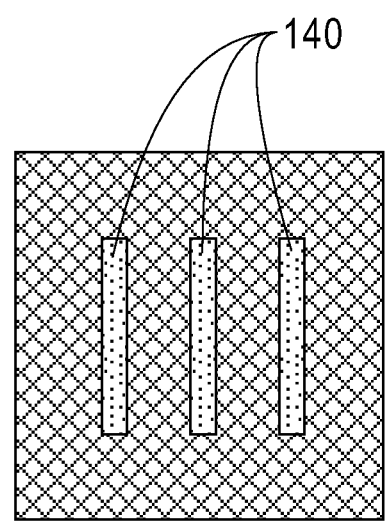
FIG. 7b is a top view of the photovoltaic cell in the fifth manufacturing step for the photovoltaic cell.

FIG. 7b is a top view of the photovoltaic cell in the fifth manufacturing step for the photovoltaic cell. The vertical interconnects 401 are shown from a top view.

Figure 8A:
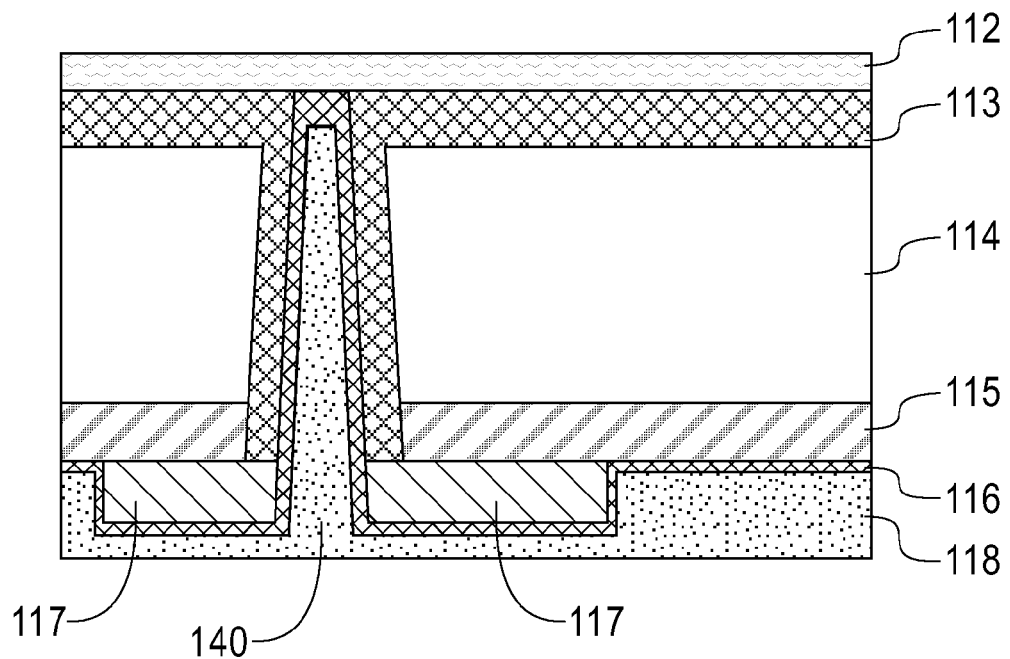
FIG. 8a is a cross-sectional view of the photovoltaic cell in the sixth manufacturing step for the photovoltaic cell.

FIG. 8a is a cross-sectional view of the photovoltaic cell in the sixth manufacturing step for the photovoltaic cell. A passivation layer 112 is deposited onto the wafer. The passivation layer 112 serves the purpose of surface passivation and commonly also to provide anti-reflection of incident light.

Figure 8B:
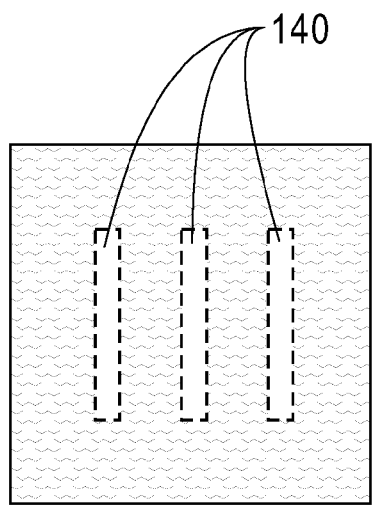
FIG. 8b is a top view of the photovoltaic cell in the sixth manufacturing step for the photovoltaic cell.

FIG. 8b is a top view of the photovoltaic cell in the sixth manufacturing step for the photovoltaic cell. The passivation layer covers the light facing side of the wafer and covers the vertical interconnects 140 as shown from the top view.

Figure 9A:
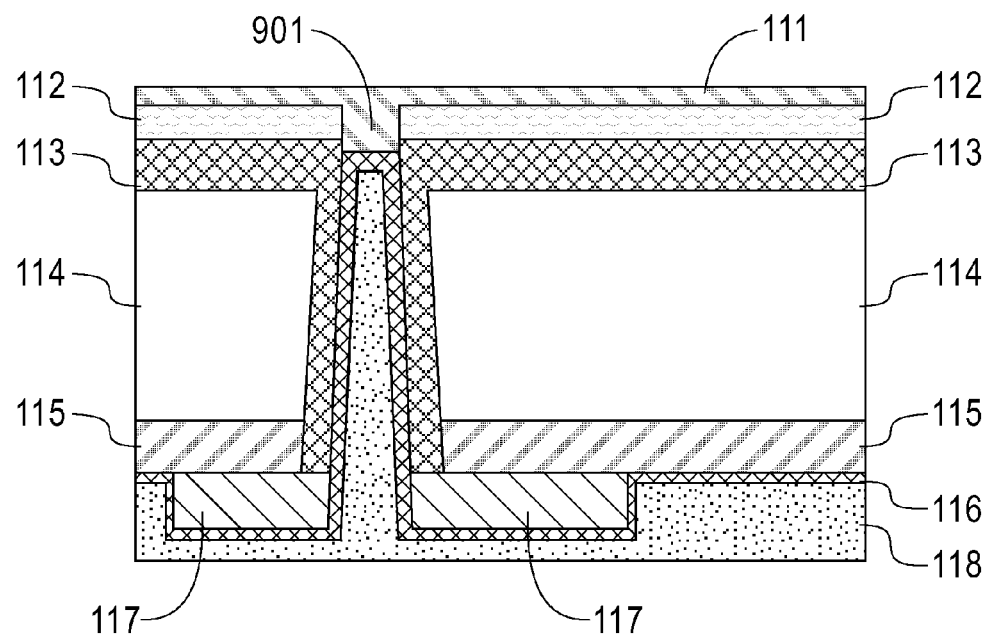
FIG. 9a is a cross-sectional view of the photovoltaic cell in the seventh manufacturing step for the photovoltaic cell.

FIG. 9a is a cross-sectional view of the photovoltaic cell in the seventh manufacturing step for the photovoltaic cell. A portion 901 of the passivation layer 111 is removed and contact layer 111 is deposited onto the passivation layer 112.

Figure 9B:
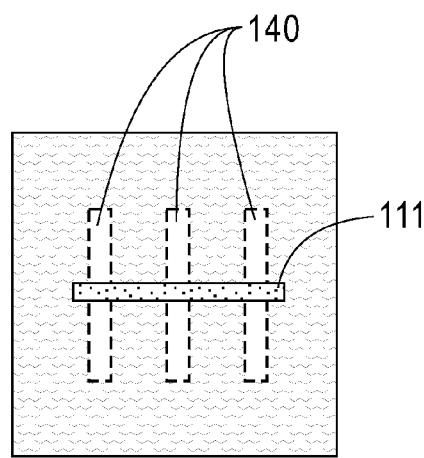
FIG. 9b is a top view of the photovoltaic cell in the seventh manufacturing step for the photovoltaic cell.

FIG. 9b is a top view of the photovoltaic cell in the seventh manufacturing step for the photovoltaic cell. The contact layer 111 consists of a grid and therefore does not covered the entire passivation layer 112. The contact layer 111 must be position such that electrical connection is made with the vertical interconnects 140 below.

Figure 10A:
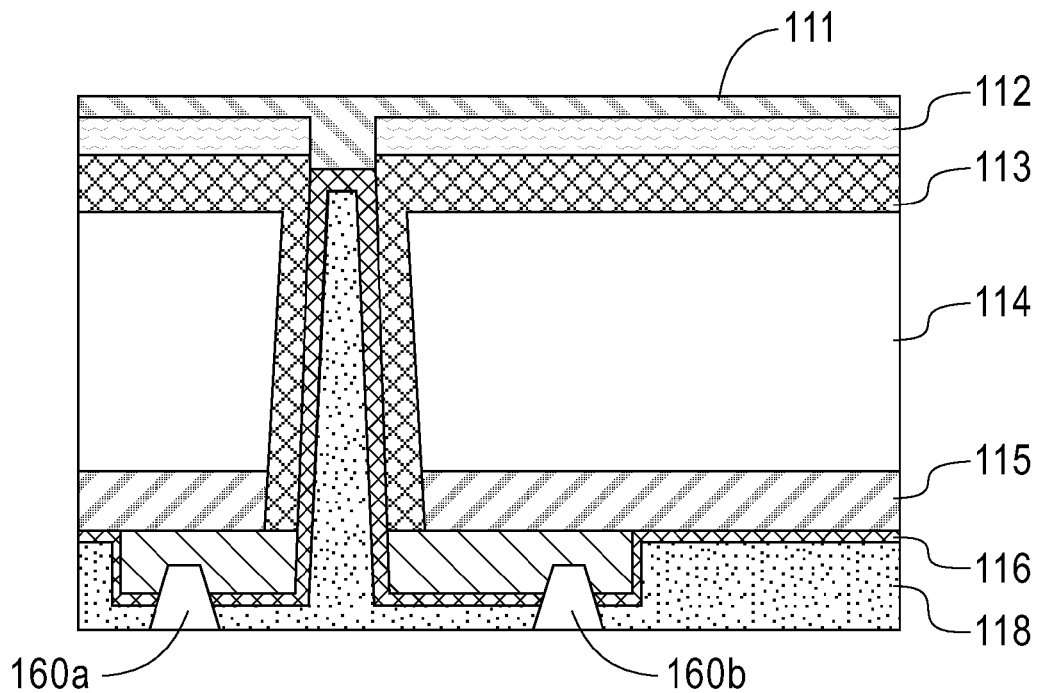
FIG. 10a is a cross-sectional view of the photovoltaic cell in the eighth manufacturing step for the photovoltaic cell.

FIG. 10a is a cross-sectional view of the photovoltaic cell in the eighth manufacturing step for the photovoltaic cell. Isolation trenches 160a and 160b are created in the bottom of the wafer. The isolation trenches 160a and 160b can be created using a laser scribing beam.

Figure 10B:
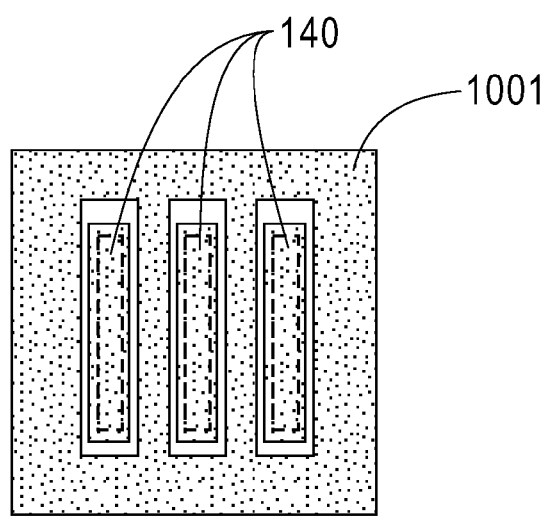
FIG. 10b is a bottom view of the photovoltaic cell in the eighth manufacturing step for the photovoltaic cell.

FIG. 10b is a bottom view of the photovoltaic cell in the eighth manufacturing step for the photovoltaic cell. The isolation trenches 160a and 160b electrically isolate the vertical interconnect 140 from the rest of the second contact layer 1001.

Figure 11:
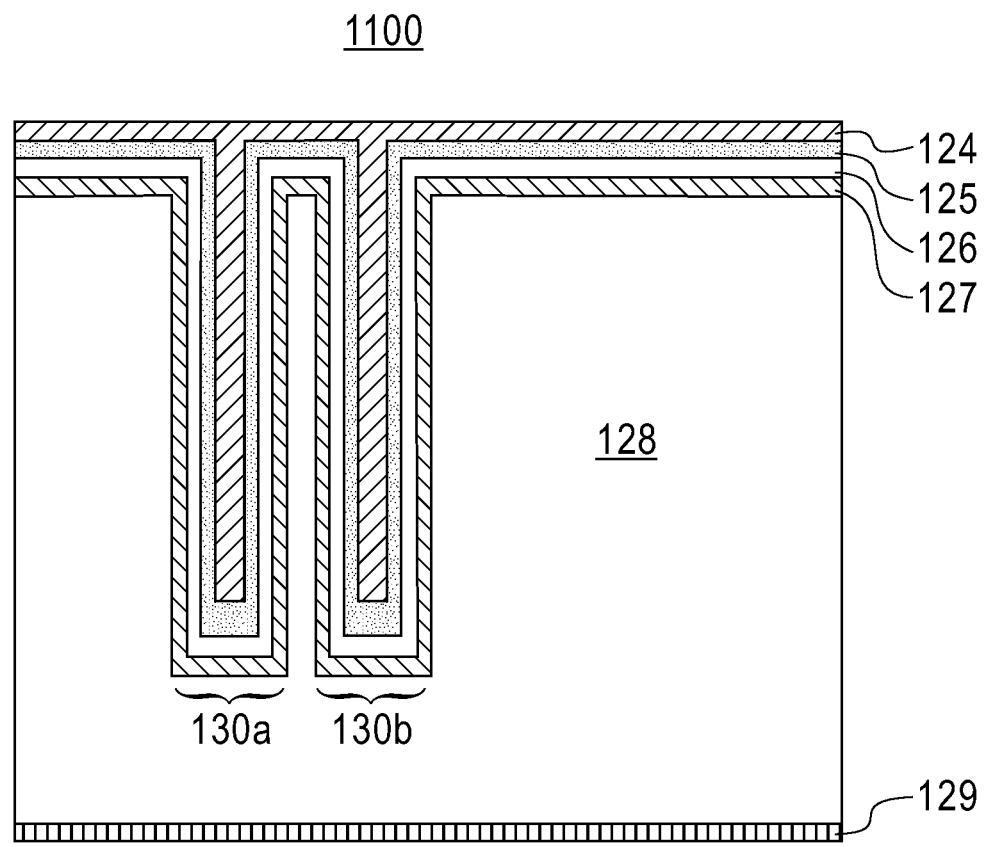
FIG. 11 is a cross-sectional view of the battery in the first manufacturing step for the battery.

FIG. 11 is a cross-sectional view of the battery in the first manufacturing step for the battery. The battery 1100 includes a cathode layer 124, an electrolyte layer 125, an anode layer 126, a barrier layer 127, a doped silicon substrate layer 128 and a second conductive contact layer 129. The battery 1100 also includes multiple battery cells 130a and 130b to enlarge the surface area of the battery 1100 and therefore increase the energy density. By connecting the battery cells 130a and 130b in parallel the battery voltage remains constant and the battery capacity is extended.

Figure 12:
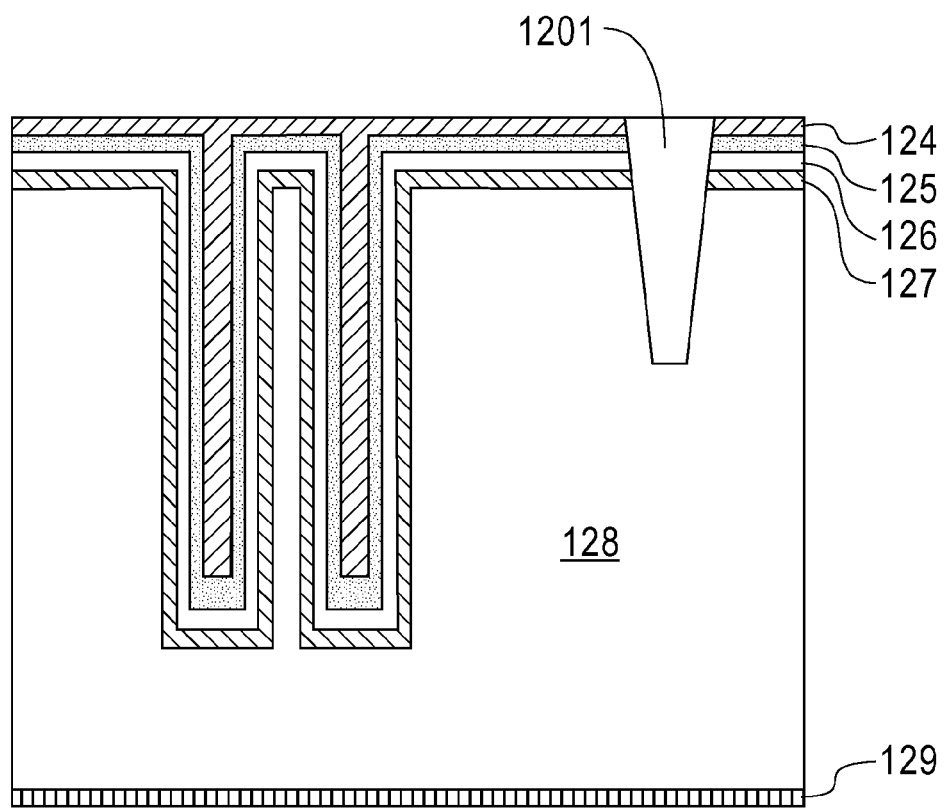
FIG. 12 is a cross-sectional view of the battery in the second manufacturing step for the battery.

FIG. 12 is a cross-sectional view of the battery in the second manufacturing step for the battery. A hole 1201 is opened through the layers 124-127 and into the substrate layer 128 below.

Figure 13:
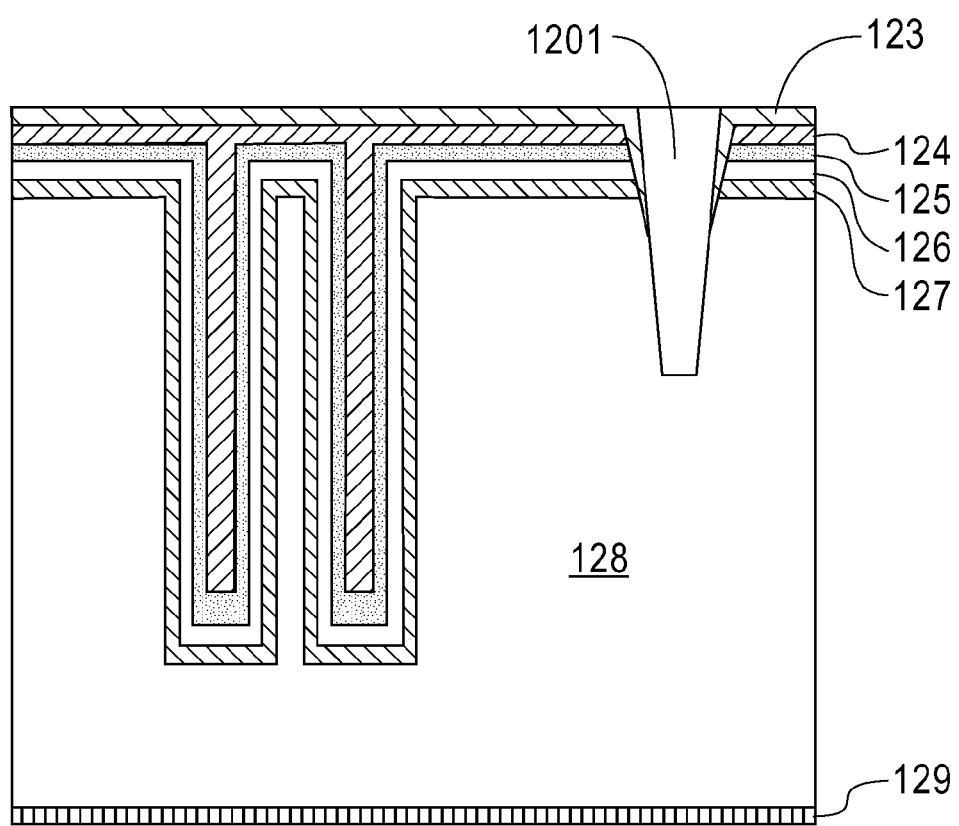
FIG. 13 is a cross-sectional view of the battery in the third manufacturing step for the battery.

FIG. 13 is a cross-sectional view of the battery in the third manufacturing step for the battery. A dielectric layer 123 is deposited such that the dielectric layer 123 is at least partially deposited in the hole 1201 at an extent sufficient to electrically insulate the hole 1201 from the layers 124-127. Thus, typically the depth of the dielectric layer 123 is at least as much as the total thickness of layers 124-127. The dielectric layer 123 should not electrically insulate the hole 1201 from the substrate layer 128.

Figure 14:
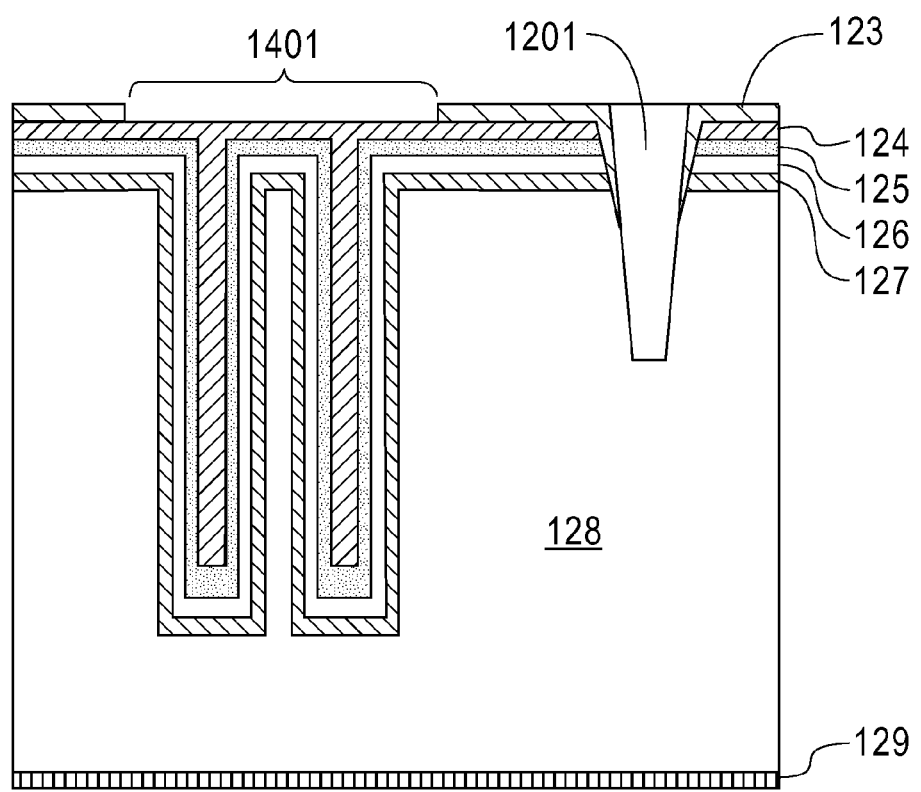
FIG. 14 is a cross-sectional view of the battery in the forth manufacturing step for the battery.

FIG. 14 is a cross-sectional view of the battery in the forth manufacturing step for the battery. A portion 1401 of the dielectric layer 123 is removed to expose the cathode layer 124 underneath. The portion 1401 of the dielectric layer 123 can be removed by a laser scribing beam.

Figure 15:
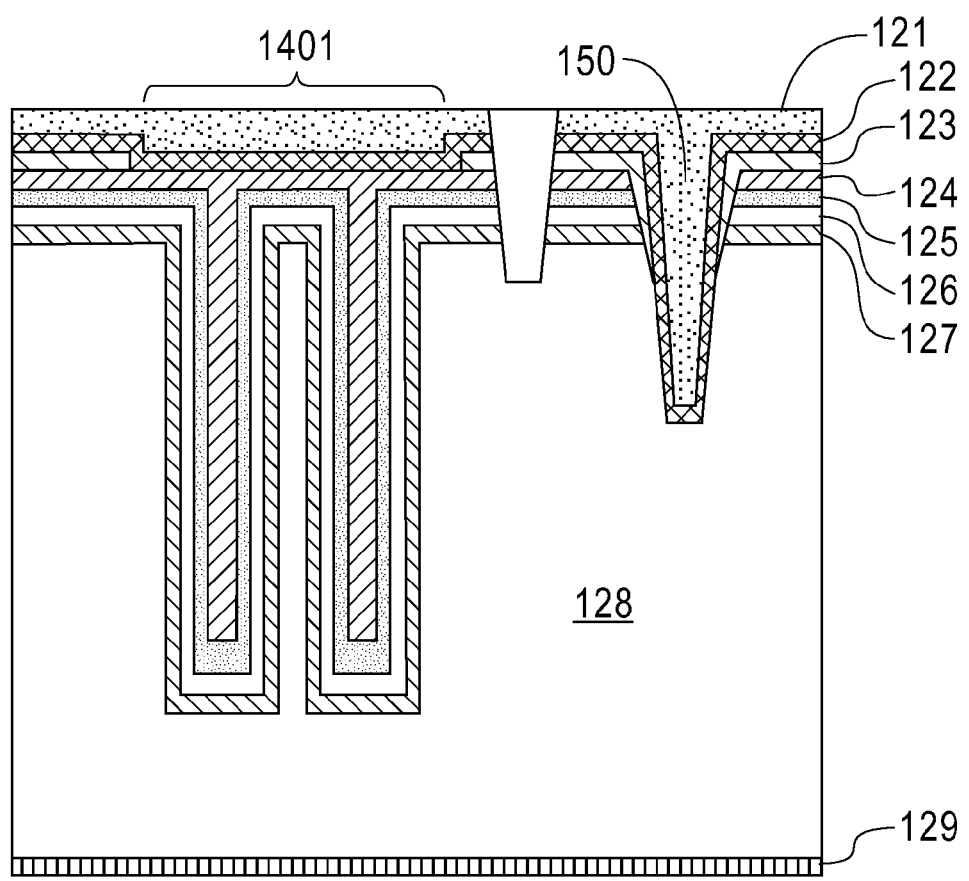
FIG. 15 is a cross-sectional view of the battery in the fifth manufacturing step for the battery.

FIG. 15 is a cross-sectional view of the battery in the fifth manufacturing step for the battery. A liner layer 122 is deposited on top of the battery such that the layer fills the portion 1401 that was removed from the dielectric layer 123 as well as the hole 1201. Then, the top of the battery is metalized to create a first contact layer 121 and the vertical interconnect 150. The vertical interconnect 150 need not extend entirely through the doped silicon substrate layer 128 because the substrate is doped to allow for electrical conductivity.

Figure 16:
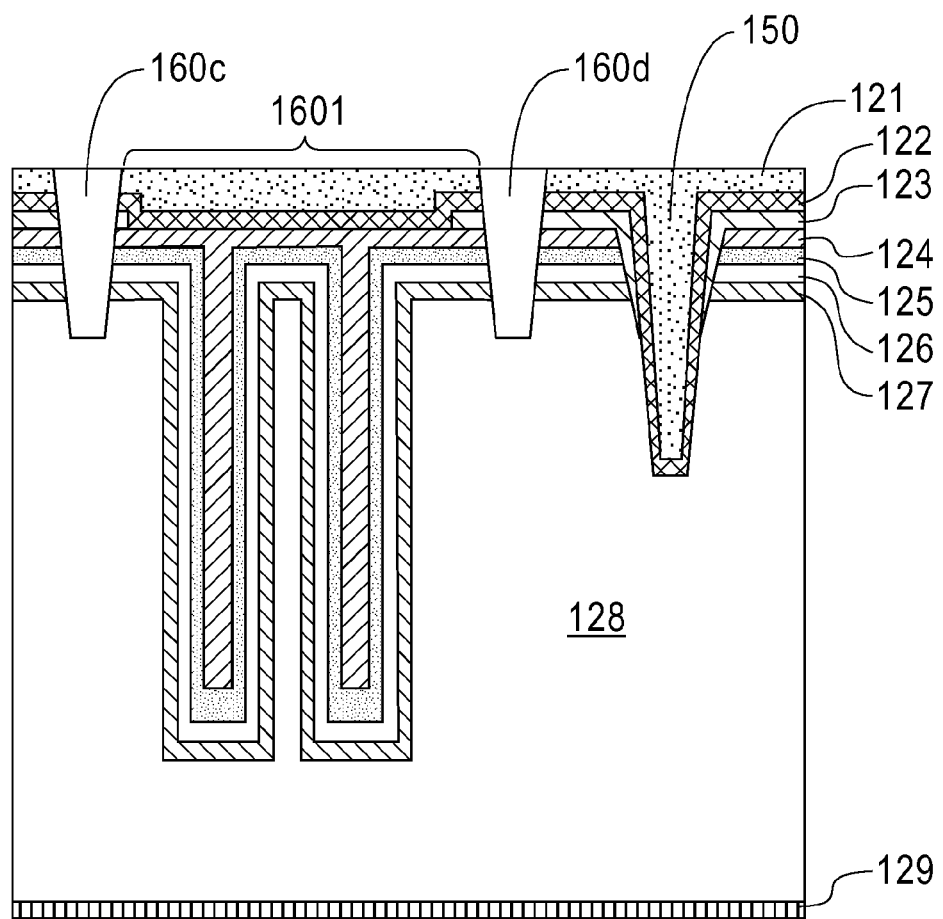
FIG. 16 is a cross-sectional view of the battery in the sixth manufacturing step for the battery.

FIG. 16 is a cross-sectional view of the battery in the sixth manufacturing step for the battery. Isolation trenches 160c and 160d are created in the top of the battery. The isolation trenches 160c and 160d can be created using a laser scribing beam. The isolation trenches 160a and 160b electrically isolate the vertical interconnect 150 from the rest of the second contact layer 1601.

Figure 17:
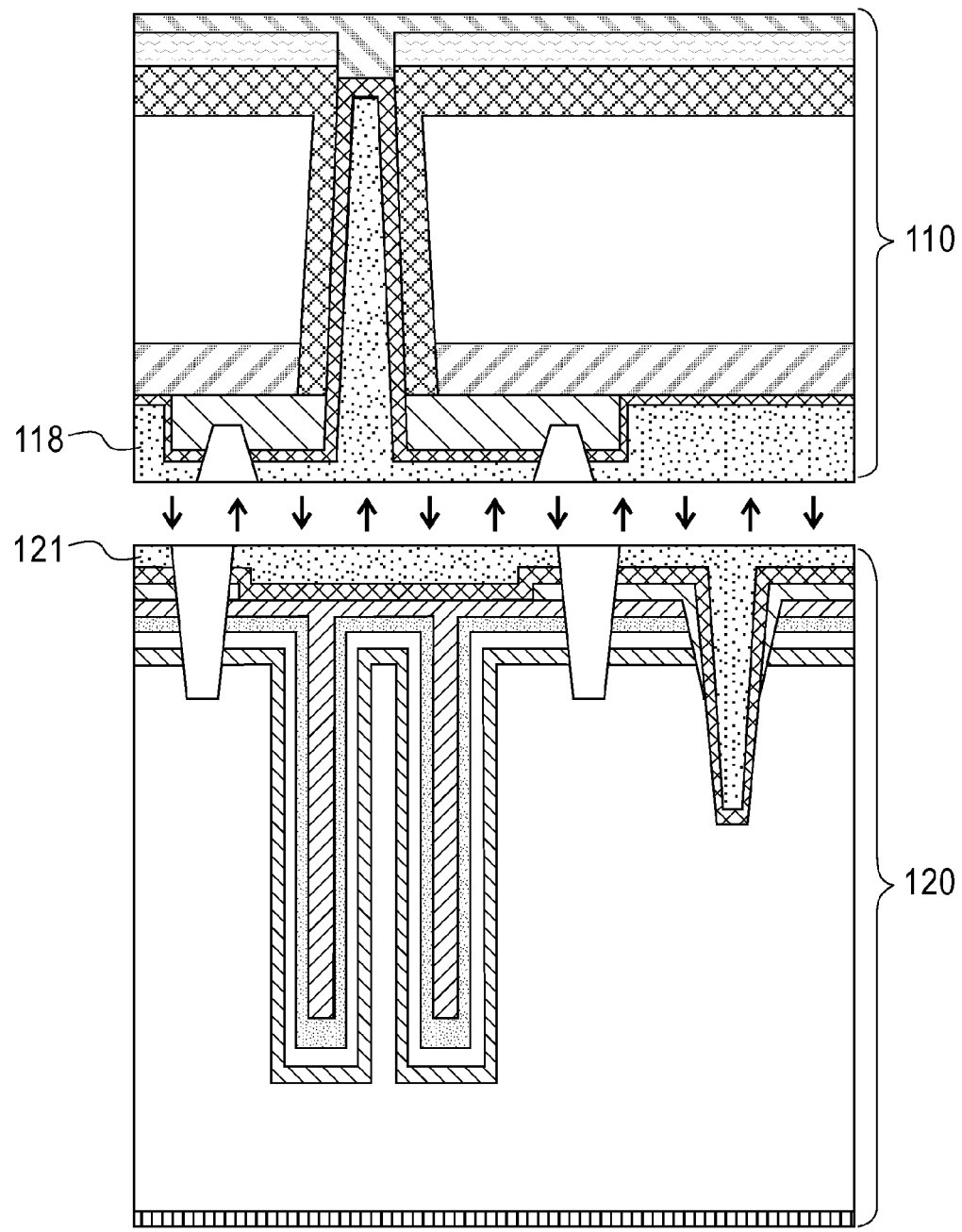
FIG. 17 is a cross-sectional view of the photovoltaic cell and the battery device in the integration manufacturing step for the integrated device according to an embodiment of the present invention.

FIG. 17 is a cross-sectional view of the photovoltaic cell and the battery device in the integration manufacturing step for the integrated device according to an embodiment of the present invention. After the photovoltaic cell 110 and the battery 120 are manufactured separately. The two are bonded together as shown in FIG. 17. The second conductive contact layer 118 of the photovoltaic cell 100 is thermal-compressively bonded to the first conductive contact layer 121 of the battery 120. The process of copper-to-copper thermal-compression bonding is known in the art of three-dimensional integration.

Figure 18:
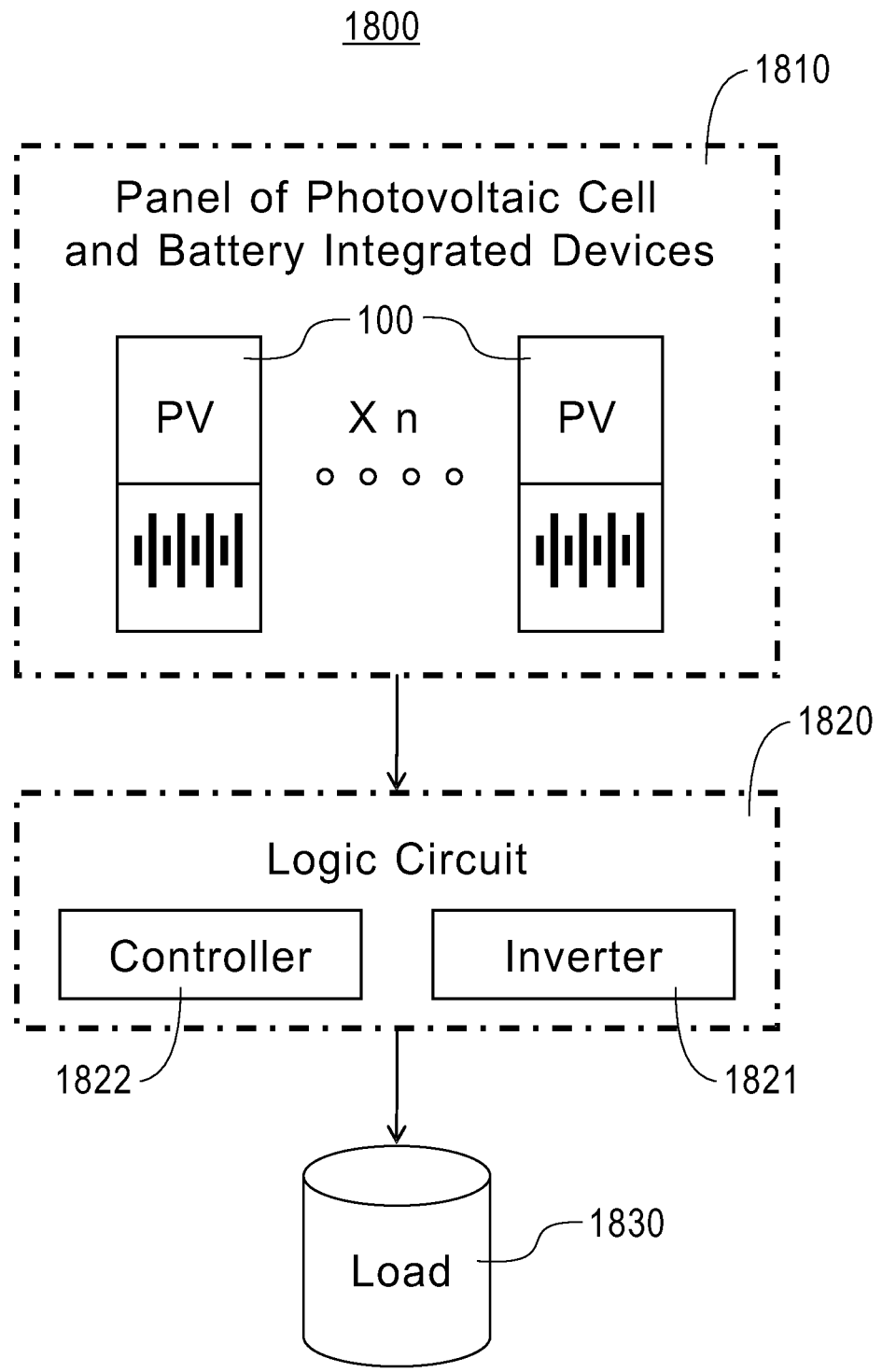
FIG. 18 is a system chart for a photovoltaic power system according to an embodiment of the present invention.

FIG. 18 is a system chart for a photovoltaic power system 1800 according to an embodiment of the present invention. The photovoltaic power system 1800 includes panel 1810 of photovoltaic cell and battery integrated devices 100. The panel 1810 can include any number of photovoltaic cell and battery integrated devices 100. The panel 1810 is connected to a logic circuit 1820 that includes an inverter 1821 and a controller 1822. The logic circuit 1820 can be built into the panel 1810 or integrated directly with the photovoltaic cell and battery integrated devices 100 using CMOS technology. The logic circuit 1820 is connected to a load 1803 powered by the electricity generated by the panel 1810 of photovoltaic cell and battery integrated devices 100.

Figure 19:
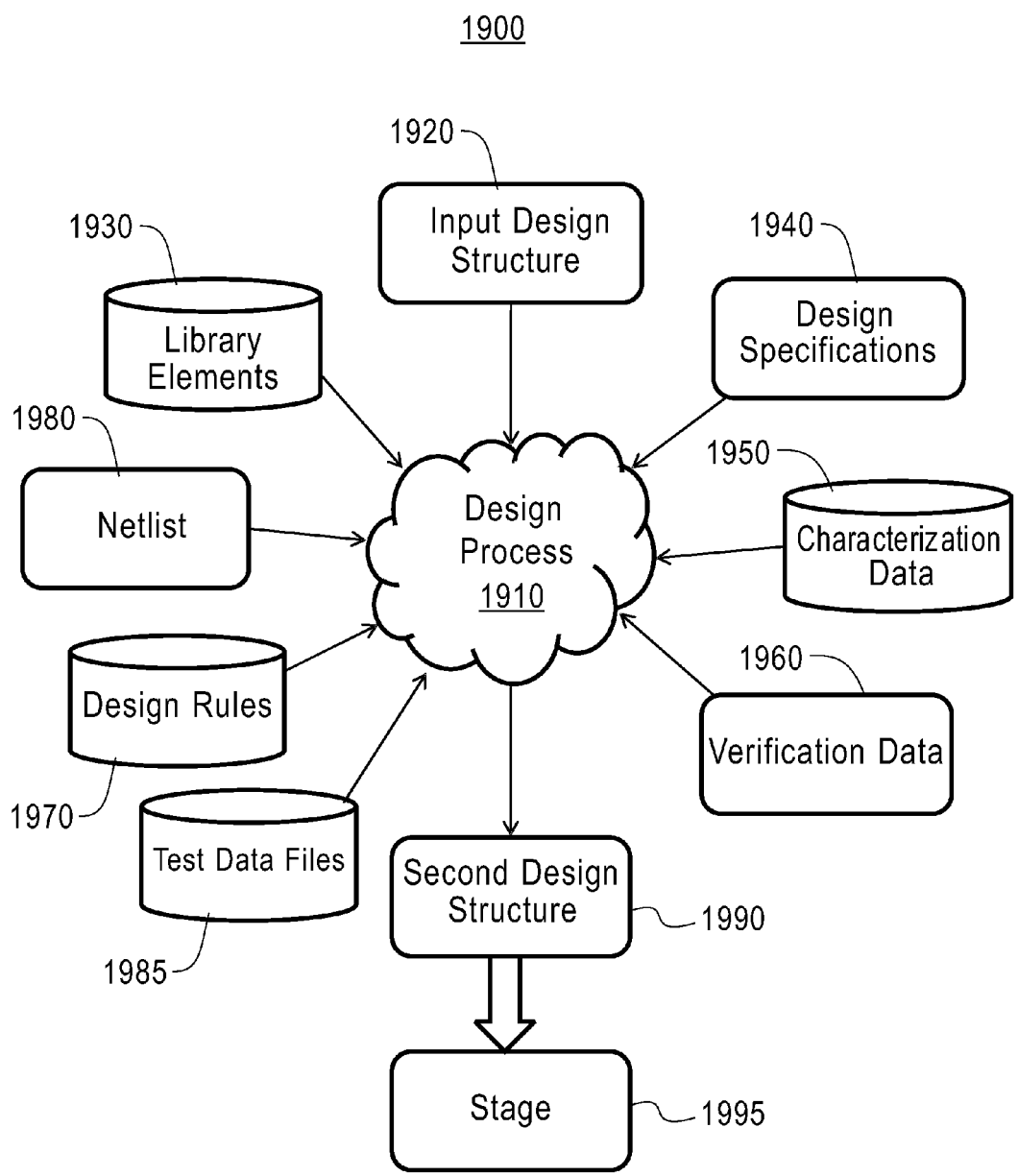
FIG. 19 is a block diagram of an exemplary design flow for the integrated photovoltaic cell and battery device according to an embodiment of the present invention.

FIG. 19 is a block diagram of an exemplary design flow 1900 used for example, in semiconductor IC logic design, simulation, test, layout, and manufacture. Design flow 1900 includes processes, machines and/or mechanisms for processing design structures or devices to generate logically or otherwise functionally equivalent representations of the design structures and/or devices described above and shown in FIG. 1 or FIGS. 3-17.

The design structures processed and/or generated by design flow 1900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1900 may vary depending on the type of representation being designed. For example, a design flow 1900 for building an application specific IC (ASIC) may differ from a design flow 1900 for designing a standard component or from a design flow 1900 for instantiating the design into a programmable array, for example a programmable gate array (PGA) or a field programmable gate array (FPGA) offered by Altera Inc. or Xilinx Inc.

FIG. 9 illustrates multiple such design structures including an input design structure 920 that is preferably processed by a design process 1910. Design structure 1920 may be a logical simulation design structure generated and processed by design process 1910 to produce a logically equivalent functional representation of a hardware device. Design structure 1920 may also or alternatively comprise data and/or program instructions that when processed by design process 1910, generate a functional representation of the physical structure of a hardware device. Whether representing functional and/or structural design features, design structure 1920 may be generated using electronic computer-aided design (EGAD) such as implemented by a core developer/designer.

When encoded on a machine-readable data transmission, gate array, or storage medium, design structure 1920 may be accessed and processed by one or more hardware and/or software modules within design process 1910 to simulate or otherwise functionally represent an electronic component, circuit, electronic or logic module, apparatus, device, or system such as those shown in FIG. 1 or FIGS. 3-17. As such, design structure 1920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1910 preferably employs and incorporates hardware and/or software modules for synthesizing, translating, or otherwise processing a design/simulation functional equivalent of the components, circuits, devices, or logic structures shown in FIG. 1 or FIGS. 3-17 to generate a Netlist 1980 which may contain design structures such as design structure 1920. Netlist 1980 may comprise, for example, compiled or otherwise processed data structures representing a list of wires, discrete components, logic gates, control circuits, I/O devices, models, etc. that describes the connections to other elements and circuits in an integrated circuit design. Netlist 1980 may be synthesized using an iterative process in which netlist 1980 is resynthesized one or more times depending on design specifications and parameters for the device. As with other design structure types described herein, netlist 1980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means Design process 1910 may include hardware and software modules for processing a variety of input data structure types including Netlist 1980. Such data structure types may reside, for example, within library elements 1930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1940, characterization data 1950, verification data 1960, design rules 1970, and test data files 1985 which may include input test patterns, output test results, and other testing information. Design process 1910 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 1910 without deviating from the scope and spirit of the invention. Design process 1910 may also include modules for performing standard circuit design processes such as timing analysis, verification, design rule checking, place and route operations, etc.

Design process 1910 employs and incorporates logic and physical design tools such as HDL compilers and simulation model build tools to process design structure 1920 together with some or all of the depicted supporting data structures along with any additional mechanical design or data (if applicable), to generate a second design structure 1990. Design structure 1990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 1920, design structure 1990 preferably comprises one or more files, data structures, or other computer-encoded data or instructions that reside on transmission or data storage media and that when processed by an EGAD system generate a logically or otherwise functionally equivalent form of one or more of the embodiments of the invention shown in FIG. 1 or FIGS. 3-17. In one embodiment, design structure 1990 may comprise a compiled, executable HDL simulation model that functionally simulates the devices shown in FIG. 1 or FIGS. 3-17.

Design structure 1990 may also employ a data format used for the exchange of layout data of integrated circuits and/or symbolic data format (e.g. information stored in a GDSII (GDS2), GL1, OASIS, map files, or any other suitable format for storing such design data structures). Design structure 1990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1 or FIGS. 3-17. Design structure 1990 may then proceed to a stage 1995 where, for example, design structure 1990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of manufacturing an integrated photovoltaic cell and battery device, the method comprising:
   providing a photovoltaic cell, wherein a first side of the photovoltaic cell includes isolated electrical contact to both an n-type layer and a p-type layer;
   providing a battery, wherein a first side of the battery includes isolated electrical contact to both a cathode and a collector; and
   bonding the photovoltaic cell and the battery to create a three-dimensional integrated device for capturing and storing solar energy,
   wherein providing the photovoltaic cell includes:
      forming a wafer having a p-type layer and a dielectric layer;
      opening a through-hole through the wafer;
      forming an n-type doped layer into an exposed surface of the p-type layer of the wafer;
      removing part of the dielectric layer of the wafer to form an isolated region of dielectric layer around the through-hole;

metallizing a side of the wafer having the isolated dielectric region to form a contact layer, wherein the through-hole is at least partially filled to form an interconnect; and removing part of the contact layer to form an isolated contact region around the interconnect which separates the interconnect from the rest of the contact layer.

2. The method of claim 1, wherein the step of providing the photovoltaic cell comprises:

forming an interconnect at least partially through the photovoltaic cell to provide electrical contact to the n-type layer on the first side of the photovoltaic cell.

3. The method of claim 1, wherein the step of providing the battery comprises: forming an interconnect at least partially through the battery to provide electrical contact to the collector on the first side of the battery.

4. The method of claim 1, wherein the step of bonding the photovoltaic cell and the battery comprises:

bonding the first side of the photovoltaic cell to the first side of the battery using compressive bonding.

5. The method of claim 1, wherein the step of providing the battery comprises:

forming a substrate;
etching at least one vertical trench into the substrate;
forming a barrier layer on the substrate;
forming an anode layer on the barrier layer;
forming an electrolyte layer on the anode layer;
forming a cathode layer on the electrolyte layer;
opening a hole through the layers into the substrate;
forming a dielectric layer on the cathode layer that also electrically isolates the hole from all of the layers;
removing a region of the dielectric layer to expose the cathode layer;
metallizing a side of the battery having the hole and the exposed cathode layer to create a contact layer, wherein the hole is filled to create an interconnect; and
removing part of the contact layer to create an isolated contact region around the interconnect which separates the interconnect from the rest of the contact layer.

6. The method of claim 1, wherein the step of forming the photovoltaic cell comprises forming a thin-film photovoltaic cell.

7. The method of claim 6, wherein the step of forming the thin-film photovoltaic cell comprises depositing a p-type layer comprising a material selected from the group consisting of: amorphous silicon, cadmium telluride, copper indium gallium diselenide, copper indium sulfide selenide, copper gallium selenide sulfide, copper zinc tin selenide sulfide, copper bismuth chalcopyrite compound, and kesterite compound.

8. The method of claim 1, wherein the step of providing the battery comprises: forming a three-dimensional integrated solid state battery having vertical battery cell structures.

9. A method of manufacturing an integrated photovoltaic cell and battery device, the method comprising:

providing a photovoltaic cell, wherein a first side of the photovoltaic cell includes isolated electrical contact to both an n-type layer and a p-type layer;

providing a battery, wherein a first side of the battery includes isolated electrical contact to both a cathode and a collector; and bonding the photovoltaic cell and the battery to create a three-dimensional integrated device for capturing and storing solar energy, wherein providing the battery includes:

forming a substrate;
etching at least one vertical trench into the substrate;
forming a barrier layer on the substrate;
forming an anode layer on the barrier layer;
forming an electrolyte layer on the anode layer;
forming a cathode layer on the electrolyte layer;
opening a hole through the layers into the substrate;
forming a dielectric layer on the cathode layer that also electrically isolates the hole from all of the layers;
removing a region of the dielectric layer to expose the cathode layer;
metallizing a side of the battery having the hole and the exposed cathode layer to create a contact layer, wherein the hole is filled to create an interconnect; and
removing part of the contact layer to create an isolated contact region around the interconnect which separates the interconnect from the rest of the contact layer.

10. The method of claim 9, wherein the step of providing the photovoltaic cell comprises:

forming an interconnect at least partially through the photovoltaic cell to provide electrical contact to the n-type layer on the first side of the photovoltaic cell.

11. The method of claim 9, wherein the step of providing the battery comprises:

forming an interconnect at least partially through the battery to provide electrical contact to the collector on the first side of the battery.

12. The method of claim 9, wherein the step of bonding the photovoltaic cell and the battery comprises:

bonding the first side of the photovoltaic cell to the first side of the battery using compressive bonding.

13. The method of claim 9, wherein the step of providing the photovoltaic cell comprises:

forming a wafer having a p-type layer and a dielectric layer;
opening a through-hole through the wafer;
forming an n-type doped layer into an exposed surface of the p-type layer of the wafer;
removing part of the dielectric layer of the wafer to form an isolated region of dielectric layer around the through-hole;
metallizing a side of the wafer having the isolated dielectric region to form a contact layer, wherein the through-hole is at least partially filled to form an interconnect; and
removing part of the contact layer to form an isolated contact region around the interconnect which separates the interconnect from the rest of the contact layer.

14. The method of claim 9, wherein the step of forming the photovoltaic cell comprises forming a thin-film photovoltaic cell.

15. The method of claim 14, wherein the step of forming the thin-film photovoltaic cell comprises depositing a p-type layer comprising a material selected from the group consisting of: amorphous silicon, cadmium telluride, copper indium gallium diselenide, copper indium sulfide selenide, copper gallium selenide sulfide, copper zinc tin selenide sulfide, copper bismuth chalcopyrite compound, and kesterite compound.

16. The method of claim 9, wherein the step of providing the battery comprises: forming a three-dimensional integrated solid state battery having vertical battery cell structures.

* * * * *